United States Patent
Rodriguez et al.

(10) Patent No.: US 9,589,917 B1
(45) Date of Patent: Mar. 7, 2017

(54) MICROWAVE MONOLITHIC INTEGRATED CIRCUIT (MMIC) HAVING INTEGRATED HIGH POWER THERMAL DISSIPATING LOAD

(71) Applicant: Raytheon Company, Waltham, MA (US)

(72) Inventors: Istvan Rodriguez, Chelsea, MA (US); Christopher M. Laighton, Boxborough, MA (US); Alan J. Bielunis, Hampstead, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/075,874

(22) Filed: Mar. 21, 2016

(51) Int. Cl.
| | |
|---|---|
| *H01L 23/66* | (2006.01) |
| *H01L 23/64* | (2006.01) |
| *H01L 23/48* | (2006.01) |
| *H01L 27/085* | (2006.01) |
| *H01L 29/20* | (2006.01) |

(52) U.S. Cl.
CPC ............ *H01L 23/66* (2013.01); *H01L 23/481* (2013.01); *H01L 23/647* (2013.01); *H01L 27/085* (2013.01); *H01L 29/2003* (2013.01); *H01L 2223/6616* (2013.01); *H01L 2223/6627* (2013.01); *H01L 2223/6683* (2013.01)

(58) Field of Classification Search
None
See application file for complete search history.

(56) References Cited

U.S. PATENT DOCUMENTS

| | | |
|---|---|---|
| 6,981,239 B2 | 12/2005 | Masuyama et al. |
| 8,836,112 B2 | 9/2014 | Hauenstein |

FOREIGN PATENT DOCUMENTS

| | | | |
|---|---|---|---|
| JP | 04-116964 A | * | 4/1992 |
| JP | 08-097367 A | * | 12/1996 |

OTHER PUBLICATIONS

Machine language translation of JP 08-097367 A.*
Machine language translation of JP 04-116964 A.*

* cited by examiner

*Primary Examiner* — Erik Kielin
(74) *Attorney, Agent, or Firm* — Daly, Crowley, Mofford & Durkee, LLP

(57) ABSTRACT

A Microwave Monolithic Integrated Circuit (MMIC) having an integrated high power load. The MMIC includes a microwave transmission line and a resistive load coupled to a terminating end of the microwave transmission line. The resistive load comprises a hollow resistive material disposed on sidewalls of a via passing through a substrate, the resistive material having an upper portion electrically connected to a terminating end of a strip conductor of the microwave transmission line strip conductor and a lower portion electrically connected to the ground plane.

17 Claims, 15 Drawing Sheets

MICROWAVE MONOLITHIC INTEGRATED CIRCUIT (MMIC) HAVING INTEGRATED HIGH POWER THERMAL DISSIPATING LOAD

TECHNICAL FIELD

This disclosure relates generally to high power thermal loads and more particularly to high power thermal loads integrated with Monolithic Microwave Integrated Circuits. (MMICs).

BACKGROUND

As is known in the art, monolithic microwave integrated circuits (MMICs) are used extensively in a wide variety of microwave circuit applications. These MMICs have a substrate with a semiconductor layer on the upper surface of the substrate. Active devices are formed with the semiconductor layer and passive devices and interconnecting transmission lines are disposed on the upper surface to form the microwave circuit. In some circuit applications it is necessary include a power dissipating, resistive load.

More particularly, in a radar system, as shown in FIG. 1A, a transmitter section sends radar pulses to an antenna through a circulator, or duplexer and radar return signals are directed by the circulator to a receiver section through a power limiter/load section and low noise amplifier (LNA), as shown. The power limiter/load section is often required to protect the sensitive low noise amplifier (LNA) from permanent degradation or catastrophic failure due to high incident signal levels appearing at the antenna element. Without a limiter, the LNA can usually tolerate signal levels well beyond its input 1 dB gain compression point (P1dB). The gain of the LNA will decrease further beyond the 1 dB point with increasing input levels as its multiple gain stages are forced into saturation. At some point, the input level will be sufficient to induce permanent degradation from excessive voltage breakdown or power dissipation in the $1^{st}$ stage transistor gate structure depending on the DC biasing approach and other design factors. For a GaAs pHEMT LNA, the damaging power level for a continuous wave (CW) input signal is typically in the range of 0.2-2 W depending on the design while GaN HEMT LNAs survive well above those input power levels. Since most receiver systems are susceptible to input power levels at the antenna well above the pHEMT LNA's damage level, a power sensitive, self-actuating attenuator circuit known as a power limiter/load section is installed ahead of the LNA to reduce incident levels at the LNA input below the damage threshold The schematic of one power limiter/load section is shown in more detail in FIG. 1B. It is noted that the power limiter/load section has a power level sensing circuit and a power dissipating load. In normal operation, a voltage VLIN is applied to the gates of FET 1 and FET 2 to place the FETs in a non-conducting condition. In such condition, an input microwave signals from a circulator in the radar system of FIG. 1A is fed to the power level sensing circuit. If the power in the input microwave signal is below a predetermined level, set by the power level sensing circuit, the input microwave signal passes to the LNA (FIG. 1A) through a quarter wave transmission line. If, on the other hand, the power level of the input microwave signal exceeds the predetermined power level, the power level sensing circuit produces a signal on the gates of both FET 1 and FET 2 placing both FET 1 and FET 2 in a conducting condition, the output side of the quarter wave transmission line is thereby connected to ground so that the short circuit impedance is transformed to an open circuit at the input side of the quarter wave transmission line therefore blocking the input microwave signal from passing to the LNA and further the input microwave signal passes through the conducting mode FET 1 to the impedance matched resistive power dissipating load. It is noted that in some cases, as during transmit mode, it is desired to have any power entering the power limiter/load section pass to the resistive power dissipating load even if the level of the input signal is less the predetermined power level. In this case, a signal VLIM is fed to the gates of both FET 1 and FET 2 placing them both in a conducting condition with the result that the microwave signal at the input to the circuit is fed to the resistive power dissipating load.

In some applications requiring high levels of power dissipation, a resistive load, such as Tantalum Nitride (TaN), is used. However, because, inter alia, of their relatively large size which would occupy a large portion of a MMIC substrate, two different substrates are used for the power limiter/load section as shown in FIGS. 1B and 1C; one substrate is a heat spreading substrate, such as a beryllium oxide (BeO) substrate, with power dissipating load on upper surface, such as TaN and a second substrate, such as a silicon carbide (SiC) substrate is used for the MMIC where a Group III-V layer, such as GaN on the upper surface of the SiC substrate is used for forming active devices, such as Field Effect Transistors (FETs) interconnected to passive devices with microwave transmission lines arranged as the power level sensing circuit. It is noted that the in this example, the resistive loads, here three resistors, R1, R2 and R3 are disposed on the upper surface of the heat spreading substrate, BeO. As is also known in the art, the microwave transmission lines typically have a ground plane conductor on the bottom surface of the substrates, as for example in a microwave transmission line of a coplanar waveguide (CPW) transmission line where electrically conductive vias are used to connect the ground plane conductors of the CPW to a ground plane conductor on the back surface of the substrate, as shown for the BeO substrate in FIG. 1D. Unfortunately, because of the large surface area of the resistor, a parasitic capacitance is created between the resistor, the underlying portion of the ground plane conductor, and the BeO there between. In order to compensate for this capacitance and provide a matched impedance to the transmission line, additional capacitors C1, C2 and inductors L1-L4 are arranged to provide an impedance matching network for the high power load section, as shown in FIG. 1E.

SUMMARY

In accordance with the disclosure, a microwave circuit is provided having a microwave transmission line, comprising: a substrate; a first electrical conductor disposed on an upper surface of the substrate; and a second electrical conductor disposed on a bottom surface of the substrate. A resistor comprising a hollow resistive material passes through the substrate, the hollow resistor being electrically connected between the first electrical conductor and the second electrical conductor.

In one embodiment, the microwave transmission line has a predetermined impedance characteristic and wherein the resistor has a resistance matched to the predetermined impedance characteristic of the transmission line.

In one embodiment, a Microwave Monolithic Integrated Circuit (MMIC) is provided having an integrated high power thermal dissipating load. The MMIC includes a microwave transmission line and a resistive load coupled to a terminating end of the microwave transmission line. The resistive load comprises a resistive material disposed on sidewalls of a via passing through a substrate, the resistive material having an upper portion electrically connected to a terminating end of the strip conductor and a lower portion electrically connected to the ground plane conductor, the lower portion of the resistive material having a vertically extending hole therein.

In one embodiment, the resistive material is hollow.

In one embodiment, the resistive material has an annular shaped cross section.

In one embodiment, the resistive material is tapered outwardly from the upper portion to the lower portion.

In one embodiment, the resistive material is a hollow cylindrical shape.

The inventors have recognized that using a hollow resistive material will enable the microwave energy to pass to the ground plane since such energy propagates along the periphery and the open region through the resistive material and also allows for thermal expansion of the resistive material. Dissipated energy is transferred to the surrounding substrate (SiC) which keeps the operating temperature low during high power applications. Further, the inventors have recognized that a resistive via has no parasitic capacitance and is inherently broadband (e.g., able to operate over multiple bands, such as frequency bands L, S, C and X) without requiring microwave tuning to target a specific one of these band such as like S-band, 2 GHz-4 GHz.

In one embodiment, a structure is provide having: a substrate; a microwave transmission line comprising: a strip conductor disposed on the upper surface of the substrate; and a ground plane conductor disposed on a bottom surface of the substrate, the microwave transmission line having an input end fed by a microwave signal; and a resistive load coupled to a terminating end of the microwave transmission line. The substrate has a via passing vertically there-through between the terminating end of the microwave transmission line. The resistive load comprises a resistive material having an annular shaped cross section disposed on sidewalls of a via, the resistive material having an upper portion electrically connected to a terminating end of the strip conductor and a lower portion electrically connected to the ground plane conductor for dissipating the microwave signal passing from the input end through the microwave transmission line to the terminating end as such microwave signal at the terminating end is fed from the terminating end towards the ground plane conductor.

In one embodiment, the microwave transmission line has a predetermined impedance characteristic and wherein the resistive of the load is matched to the predetermined broadband impedance characteristic of the transmission line.

In one embodiment, a monolithic integrated circuit is provided having: a substrate; a semiconductor layer an upper surface of the substrate; a ground plane conductor disposed on a bottom surface of the substrate; and a microwave circuit fed by a microwave signal. The microwave circuit includes: an active device formed with the semiconductor layer, the active device having: an input electrode fed by the microwave signal; a control electrode fed by a control signal; and an output electrode, the microwave signal fed to the input electrode being: coupled to the output electrode; or being electrically decoupled from the output electrode, selectively in accordance with the control signal and a microwave transmission line comprising: a strip conductor disposed on the upper surface of the substrate electrically connected to the output electrode of the active device. A resistive load is coupled to the output electrode, the resistive load comprising an annular shaped resistive material disposed on sidewalls of via, the via passing vertically through the substrate, the resistive material having an upper portion electrically connected to the strip conductor and a lower portion electrically connected to the ground plane conductor for dissipating the microwave signal selectively coupled to the output electrode as such microwave signal is fed from the strip conductor towards the ground plane conductor.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 2B' is a cross sectional view of a portion of the load/limiter section of FIG. 2A, such cross section being taken along line 2B'-2B' of FIG. 2B;

Like reference symbols in the various drawings indicate like elements.

DETAILED DESCRIPTION

Figure 2A:
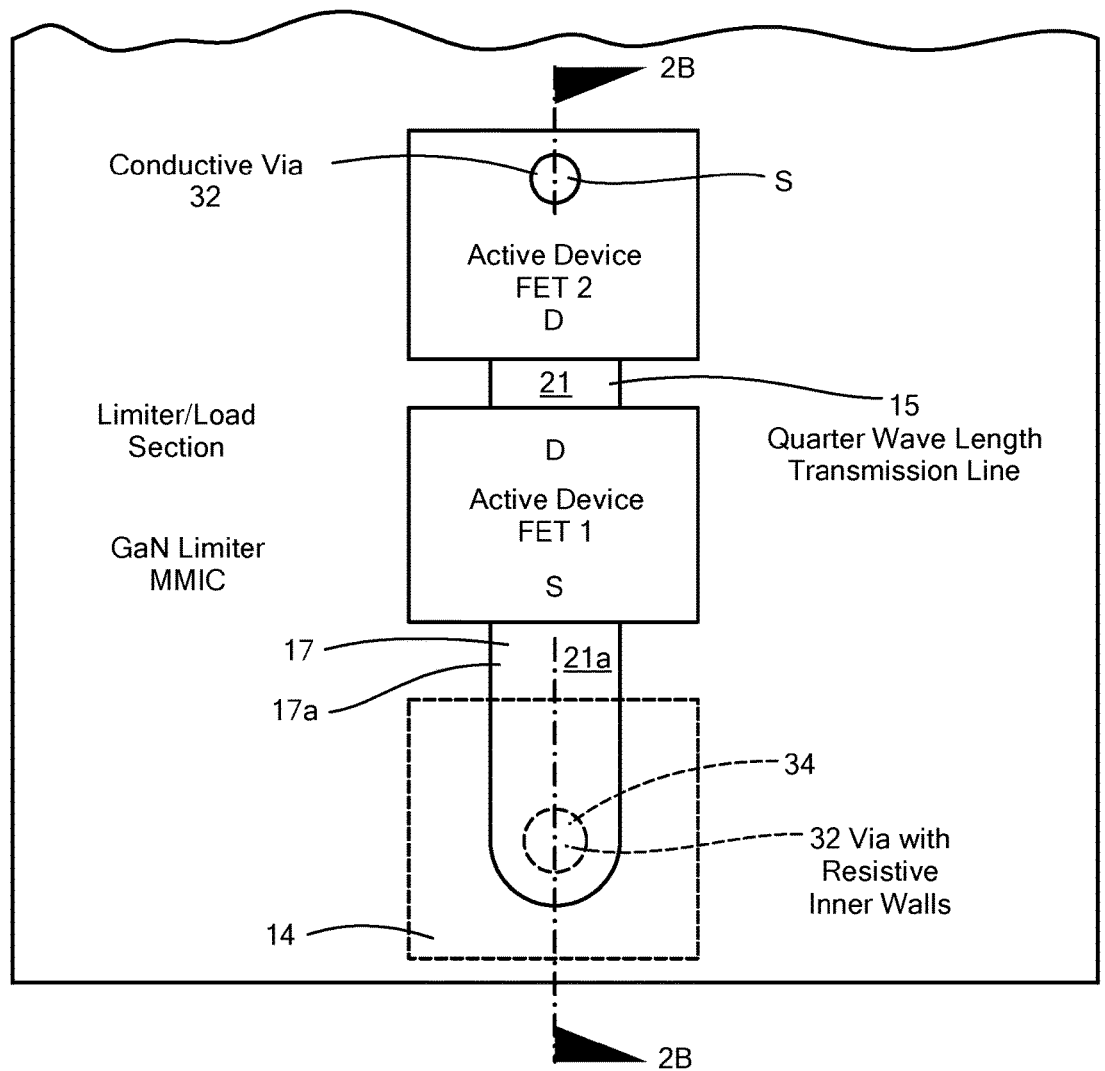
FIG. 2A is a plan view of a portion of a load/limiter section according to the disclosure.
Figure 2B:
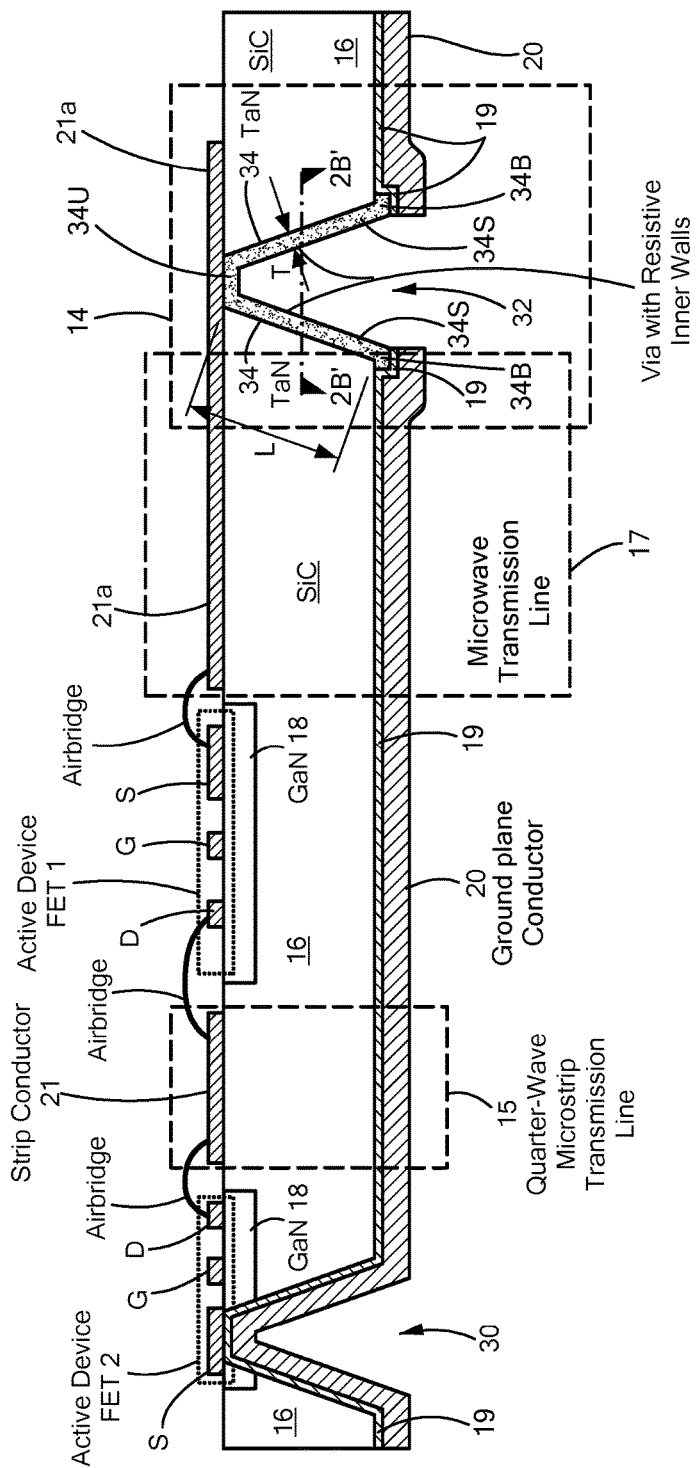
FIG. 2B is a cross sectional view of the load/limiter section of FIG. 2A according to the disclosure, such cross section being taken along line 2B-2B of FIG. 2A.
Figure 2B:
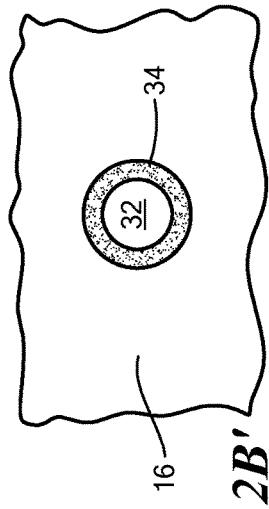
Figure 2C:
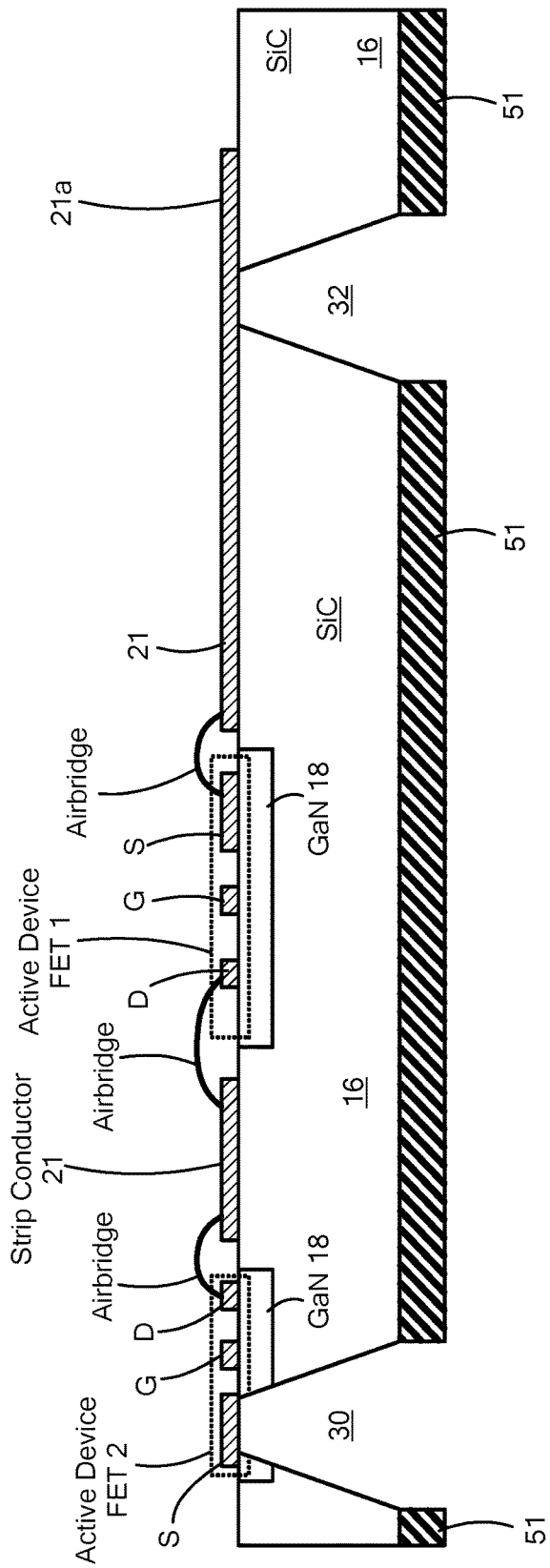
FIGS. 2C through 2I are cross sectional views of the load/limiter section of FIGS. 2A and 2B according to the disclosure at various stages in the fabrication thereof, such cross sections being taken along line 2B-2B.
Figure 2D:
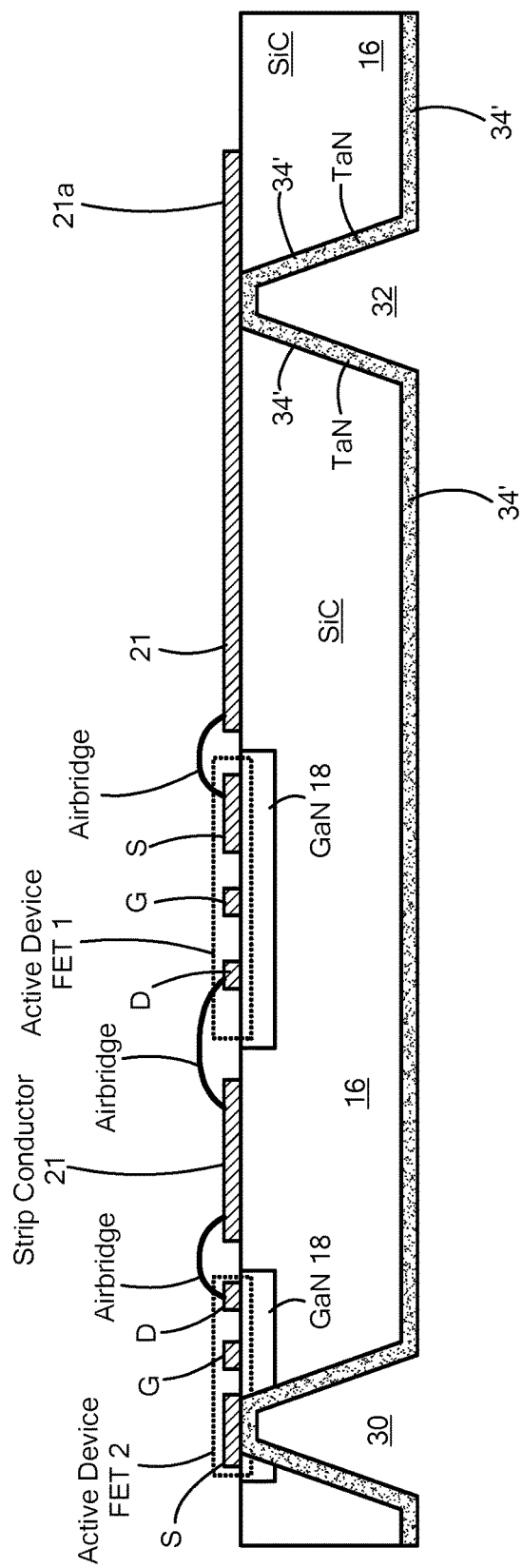
Figure 2E:
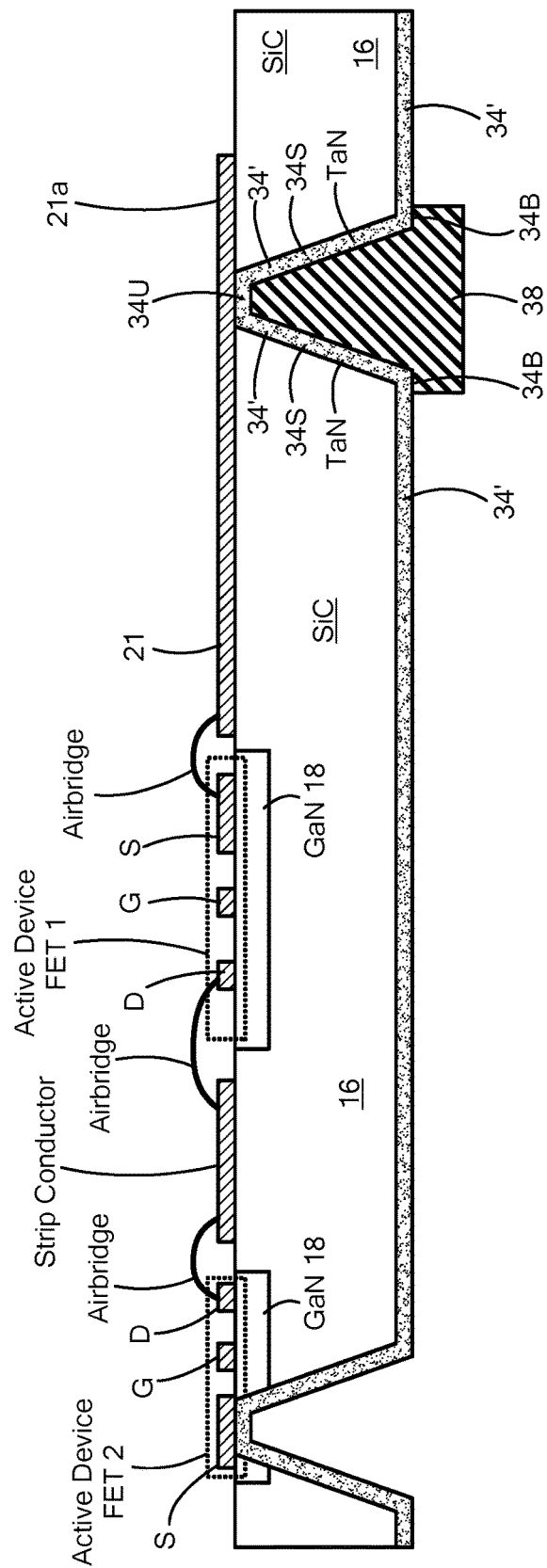
Figure 2F:
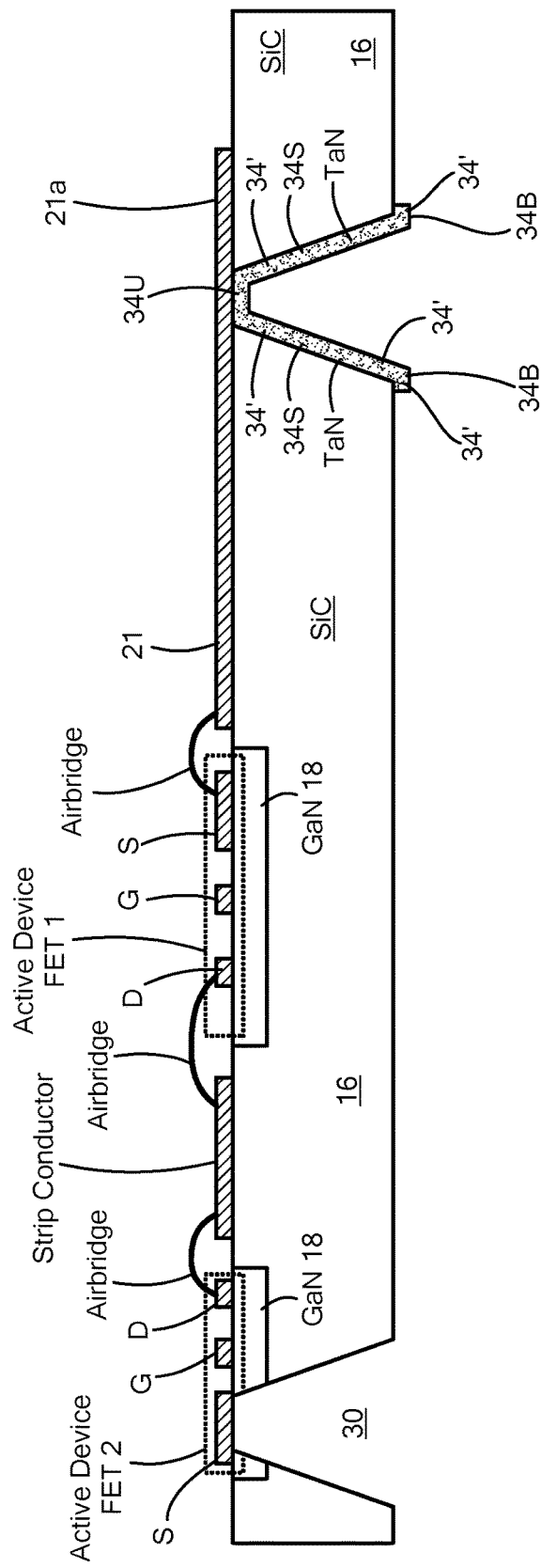
Figure 2G:
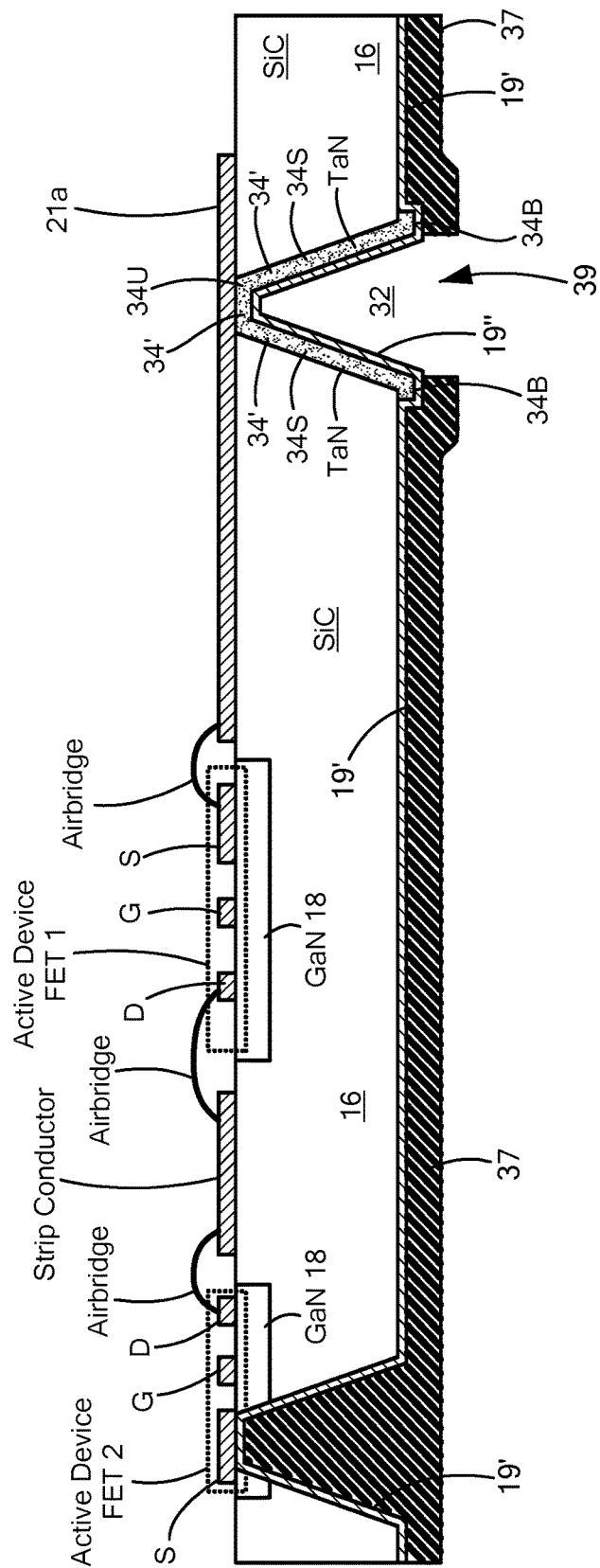
Figure 2H:
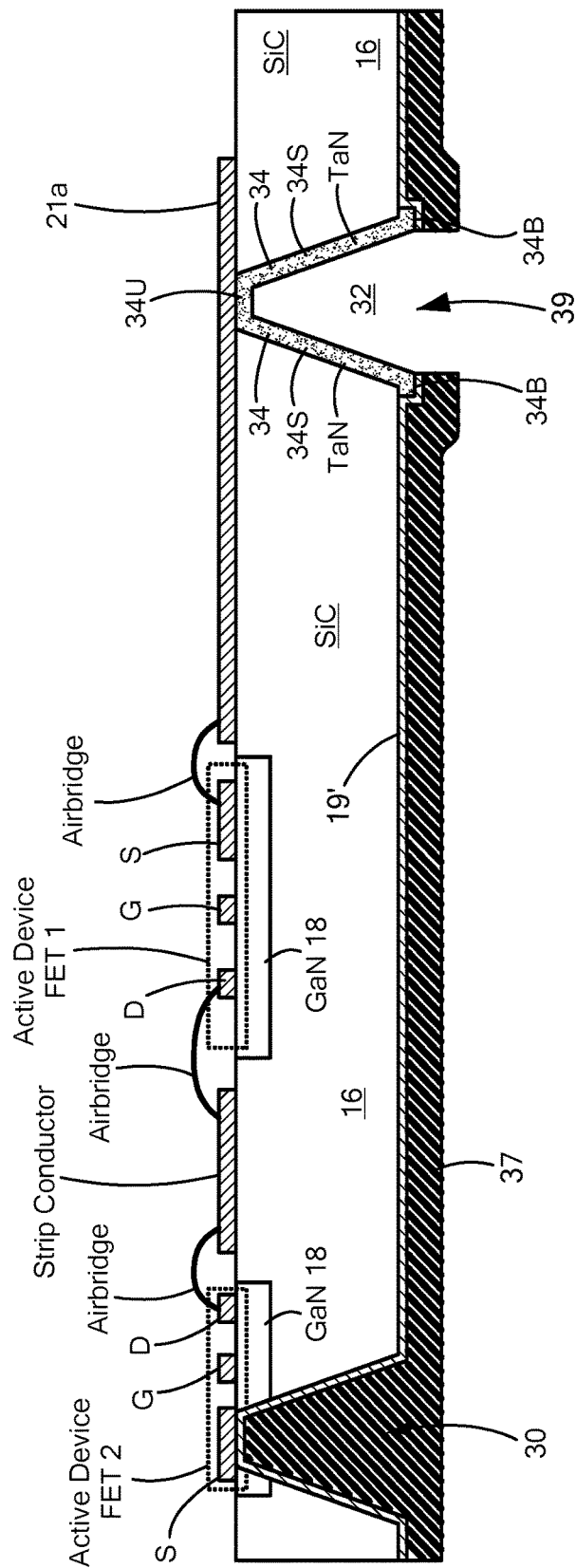
Figure 2I:
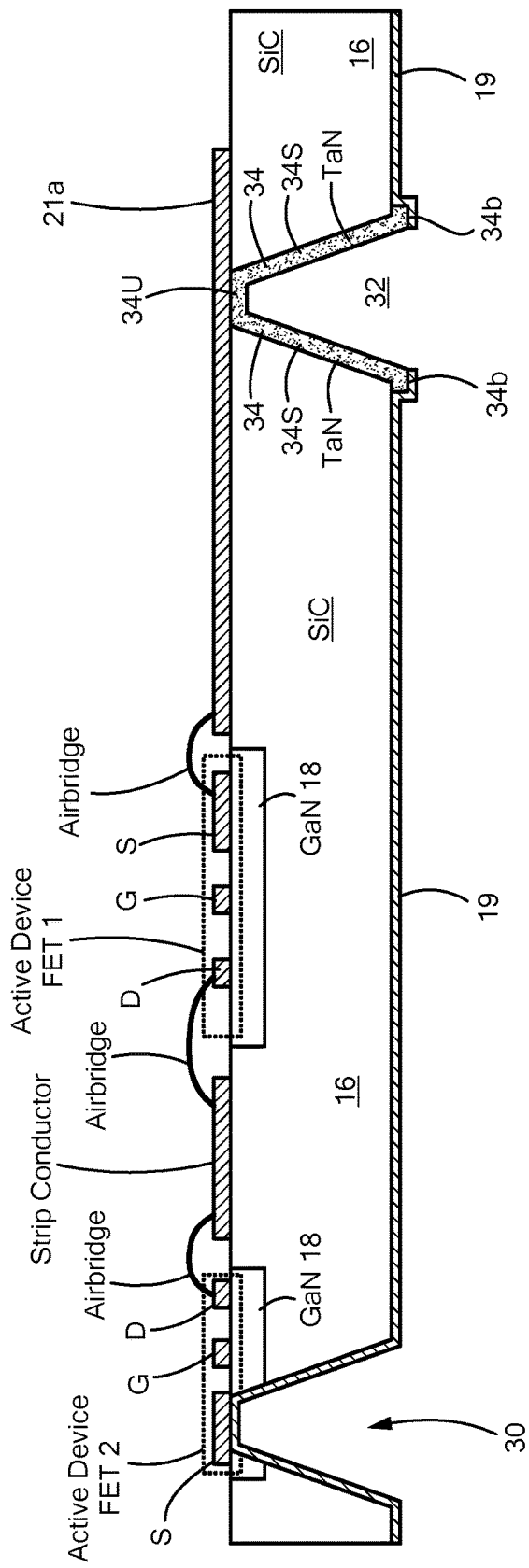
Figure 2J:
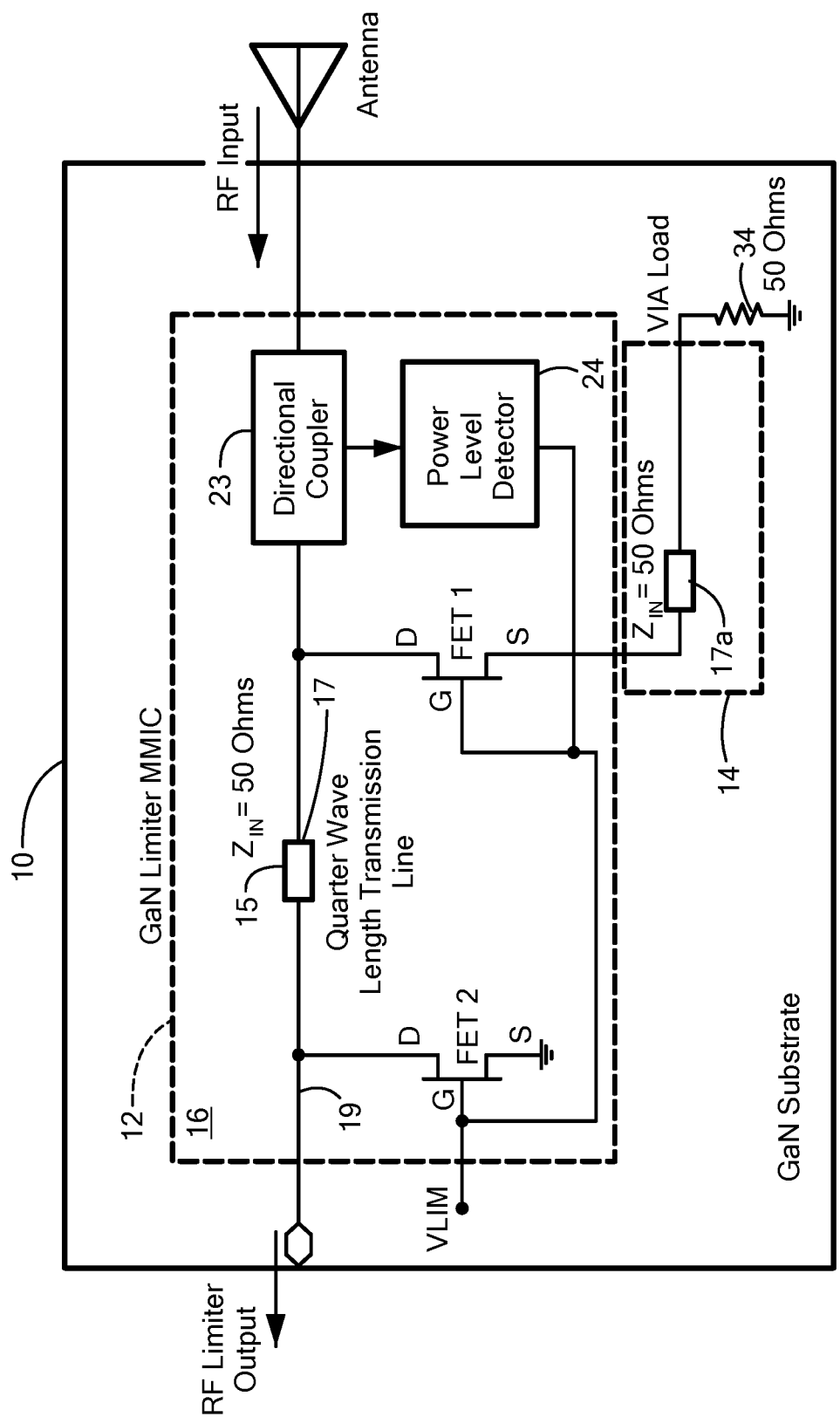
FIG. 2J is a schematic diagram of the limiter/load section according to the disclosure formed as a MMIC.

Referring now to FIGS. 2A and 2J, a power limiter/load section 10 is shown. Here the power limiter/load section 10 with both a power limiter circuit 12 (FIG. 2E) and a power dissipating load 14 for the power limiter circuit 12 is formed on a single substrate 16 to form a Microwave Monolithic Integrated Circuit (MMIC). Here the substrate 16 is a silicon carbide (SiC) substrate having a Group III-V, here for example GaN, semiconductor layer 18 (FIG. 2B) formed on the upper surface of the substrate 16 using any conventional processing. An electrically conductive seed layer 19, used to grow or form a ground plane conductor 20 thereon, is disposed on the bottom surface of the substrate 16 as shown (FIG. 2B) and the ground plane conductor 20 is disposed on the seed layer 19, as shown.

The power limiter/load section 10 includes a pair of active devices FET 1 and FET 2 formed in with the semiconductor layer 18 along with microwave transmission lines 17, here 50 ohm microstrip transmission lines used in interconnecting the active devices FET 1 and FET 2 and used to connect FET 1 to the power dissipating load 14, here a resistor 34, as shown in the schematic of the power limiter/load section 10 in FIG. 2J. Thus, each one of the microwave transmission lines 17 is a microstrip transmission line and includes a strip conductor 21 on the upper surface of the substrate 16 separated from a bottom conductor, here ground plane conductor 20, by the substrate 16. It is noted that one of the microwave transmission lines 17 is the quarter wavelength microstrip transmission line section 15. As noted above, the power sensing circuit 12 and the power dissipating load 14 are formed on the same substrate 16 as an MMIC with circuit components of the power sensing circuit 12 having 50 ohm input and output impedances, with the power dissipating load 14 having 50 ohm input impedance and with the circuit components of the power sensing circuit 12 all being interconnected with transmission lines 17 having a predetermined broadband impedance characteristic. $Z_o$, here 50 ohm. The resistor 34 has a 5 ohm resistance, is thus impedance matched to the transmission lines 17.

More particularly, and referring to FIG. 2J, the input microwave signal is fed to a directional coupler 23. One output of the directional coupler 23 is connected to the drain electrode (D) of FET 1 and to an input side of a quarter wave length transmission line section 15 and a second output of the directional coupler 23 couples a predetermined fractional portion of the input microwave signal to a power level detector 24. The output side of the quarter wave length transmission line section 15 is connected to the drain (D) electrode of FET 2. It is noted that the quarter wave length transmission line 15 has a length $n\lambda/4$ where n is an odd integer and $\lambda$ is the nominal wavelength of the input microwave signal. The output of the power level detector 24 is fed to the control (gate electrode (G)) of FET 1. The control electrodes (the gate electrodes (G)) of the FET 1 and FET 2 are fed by the control signal VLIN. The output electrode, here the source electrode (S) of FET 1 is connected to the ground through the resistive power dissipating load 14. The source electrode (S) of FET 2 is connected to ground. The power level detector 24 is connected the gate electrodes (G) of both FET 1 and FET 2.

Figure 1A:
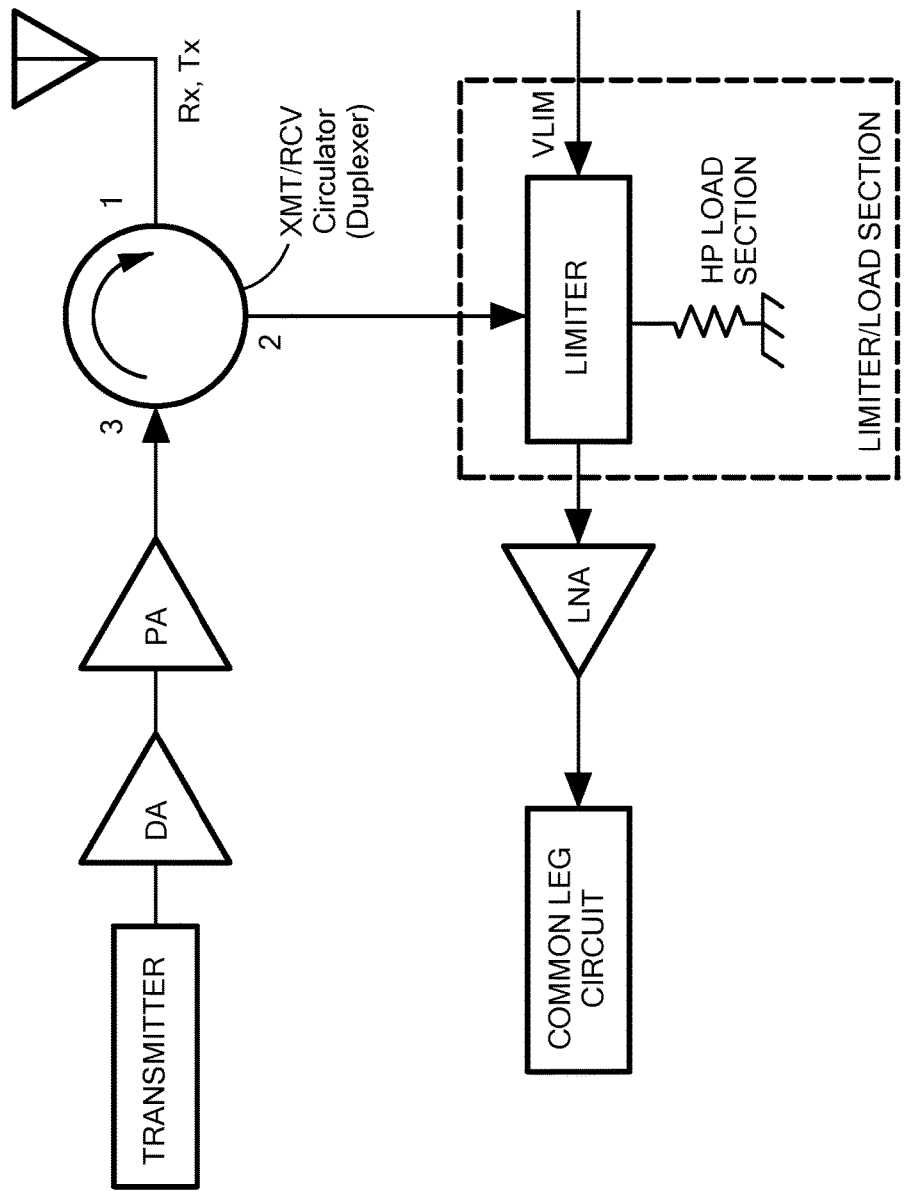
FIG. 1A is a block diagram of a radar system having a limiter/load section according to the PRIOR ART.
Figure 1B:
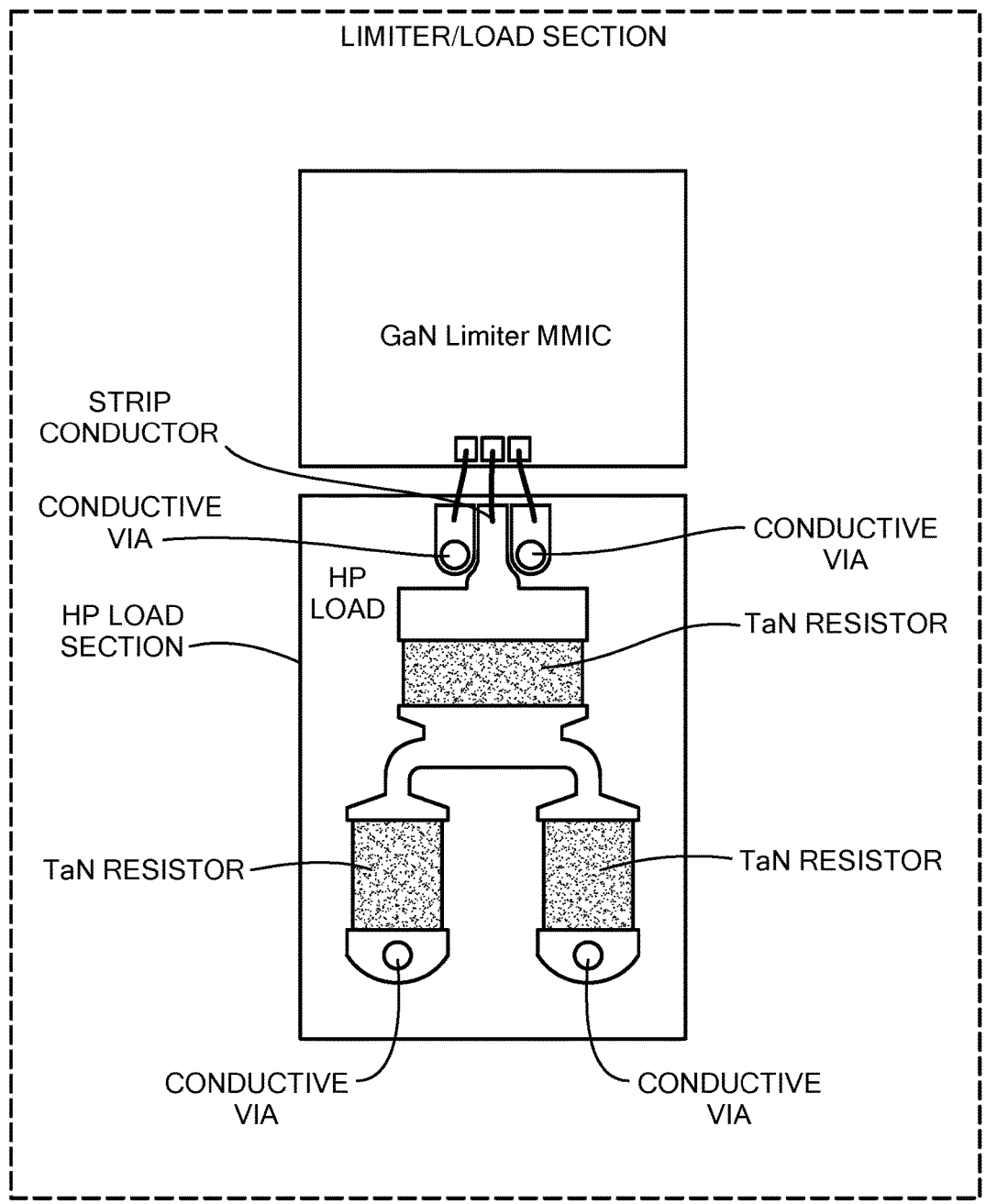
FIG. 1B is a plan view of the limiter/load section according to the PRIOR ART.
Figure 1C:
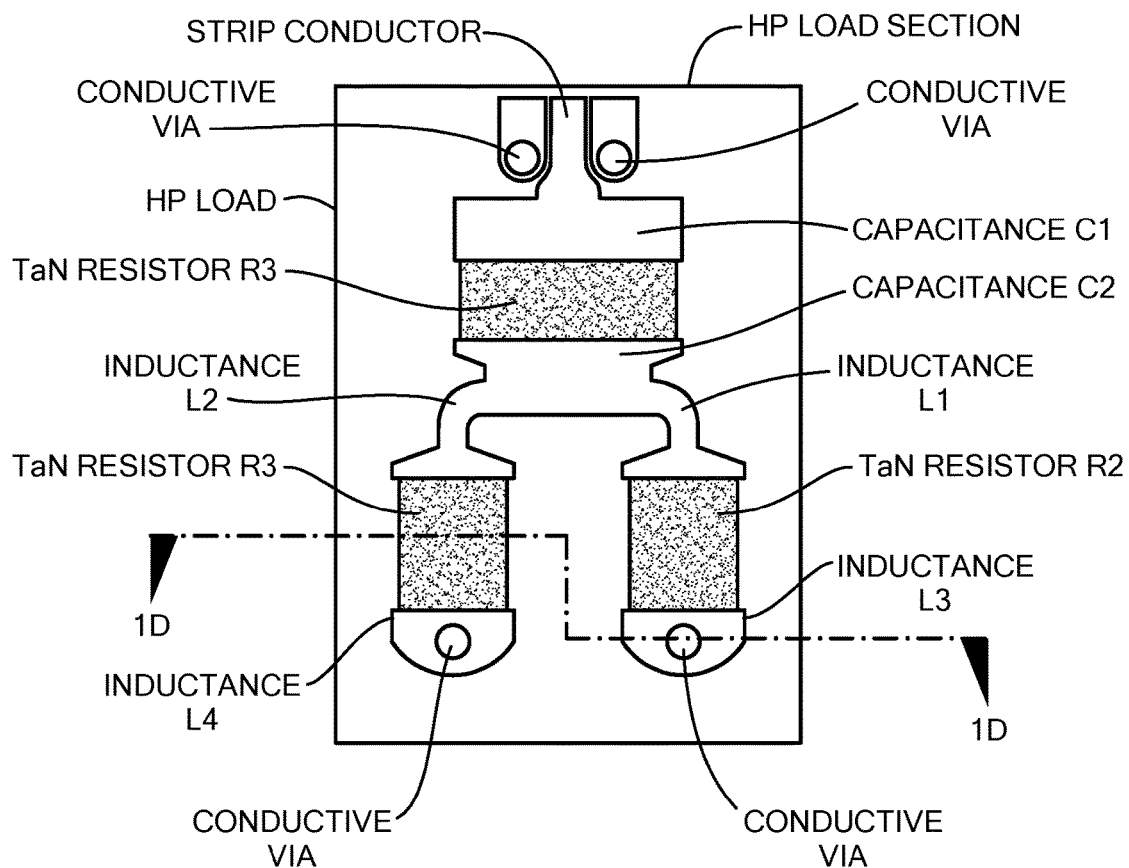
FIG. 1C is a plan view of a high power (HP) load section of limiter/load section of FIG. 1B according to the PRIOR ART.
Figure 1D:
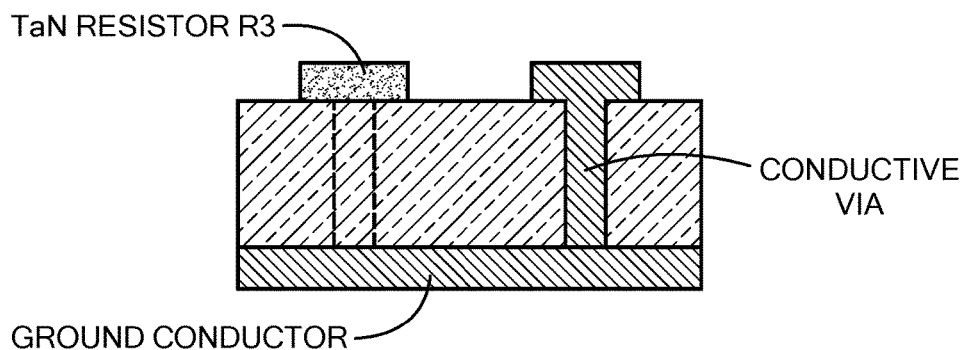
FIG. 1D is a cross sectional view of the HP load of FIG. 1C, such cross section being taken along line 1D-1D.
Figure 1E:
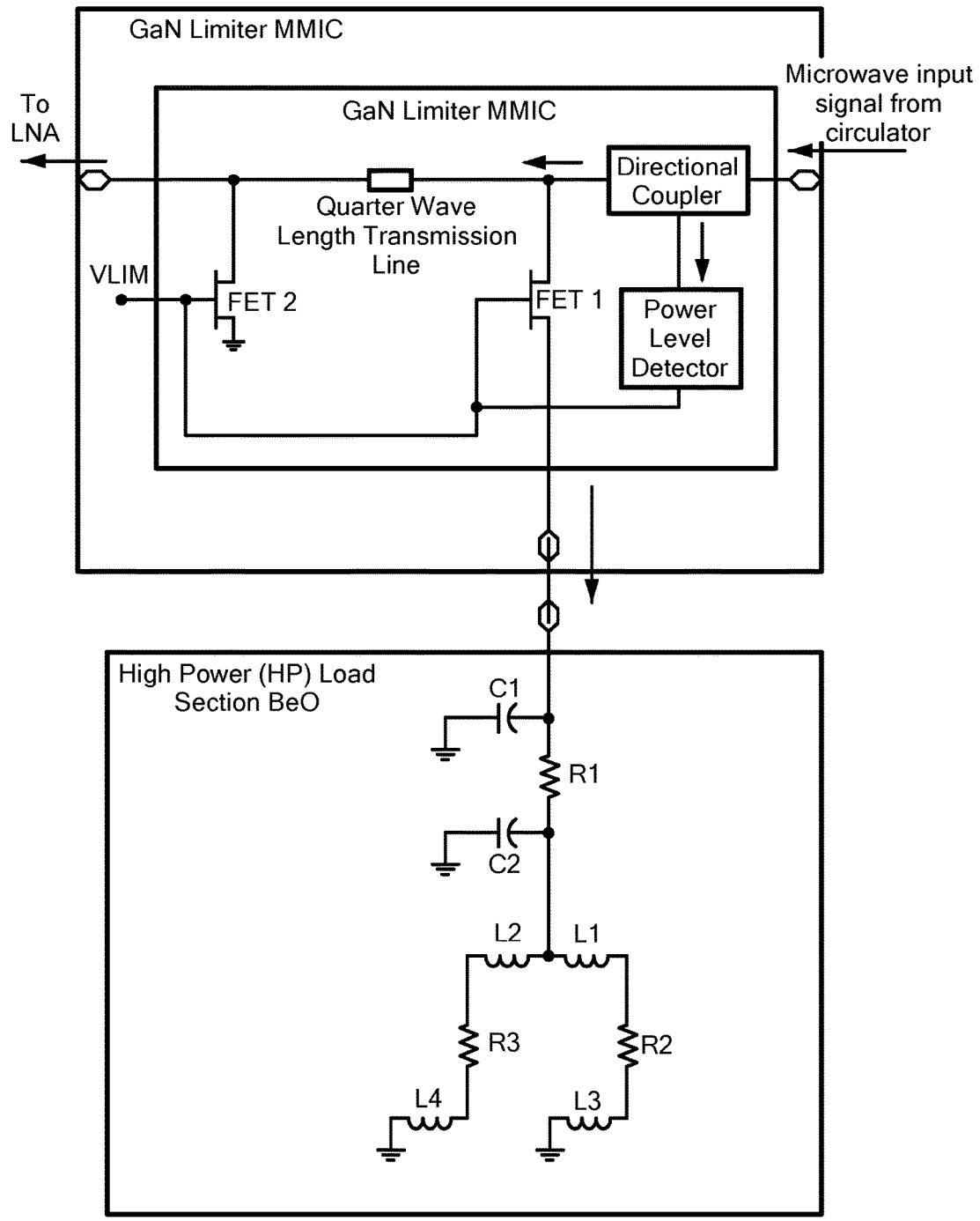
FIG. 1E is schematic diagram of the limiter/load section according to the PRIOR ART.

Thus, in normal operation, a control signal, here a voltage VLIN, is applied to the gate electrodes (G) of FET1 and FET2 to place the FETs in a non-conducting condition. In such condition, an input microwave signals from a circulator in the radar system of FIG. 1A is fed to the power level sensing circuit 12. If the power in the input microwave signal is below a predetermined level, set by the power level sensing circuit 12, the input microwave signal passes to the LNA (FIG. 1A) through a quarter wave transmission line section 15. If, on the other hand, the power level of the input microwave signal exceeds the predetermined power level, the power level sensing circuit 12 produces a signal on the gates of both FET 1 and FET 2 placing both FPET 1 and FET 2 in a conducting condition, the output side of the quarter wave transmission line section 15 is thereby connected to ground so that the impedance at the input side of the quarter wave transmission line section 15 is high blocking the input microwave signal from passing to the LNA and further the input microwave signal passes through the conducting mode FET 1 to the resistor 34 of the resistive power dissipating load 14. It is noted that in some cases, as during transmit mode, it is desired to have any power entering the power limiter/load section 10 pass to the resistor 34 of the resistive power dissipating load 14 even if the level of the input signal is less the predetermined power level. In this case, a signal VLIM is fed to the gates of both FET 1 and FET 2 placing them both in a conducting condition with the result that the microwave signal at the input to the power limiter/load section 10 is fed to the resistor 34 of the resistive power dissipating load 14.

Referring to FIGS. 2A, 2B and 2G, it is noted that while the source electrode (S) of FET 2 is connected through the seed layer 19 to the ground plane conductor 20 with an electrically conductive via 30 (FIG. 2B) while source electrode (S) of FET 1 is connected to the resistor 34 of the resistive power dissipating load 14 through one of the transmission line 17, here indicated as transmission line 17a. More particularly, the resistor 34 is electrically connected between the source electrode (S) of FET 1 and the ground plane conductor 20 through the seed layer 19. It is noted that the resistor 34 is formed from an outwardly tapered, annular-shaped resistive material, here for example, tantalum nitride (TaN), having a thickness T and length L disposed on outwardly tapered sidewalls of via 32, the via 32 passing vertically through the substrate 16. More particularly, the upper portion 34U of resistive material of resistor 34 is in contact with and electrically connected to one of the strip conductors 21, here, for example, the strip conductor 21a. The strip conductor 21a, which is the upper conductor portion of one of the microwave transmission lines 17a, is connected between the source electrode (S) of the FET 1 and the top of the resistive material of resistor 34 through one of the 50 ohm transmission lines 17a. The lower or bottom portion 34B of the resistive material of resistor 34 is electrically connected to the ground plane conductor 20 through the seed layer 19. It is noted that there is no electrically conductive material on the sidewalls 34S of the resistive material of resistor 34. Thus, the resistive material of resistor 34 and hence resistor 34 itself is hollow and forms the power dissipating load 14, here the resistor 34 having a length L and a thickness T. A cross section of the resistive material of resistor 34 is shown in FIG. 2B'; it being note that the via 32 provides a hole through the resistor 34.

Thus, a microwave circuit 10 is provided having microwave transmission lines 17, here microstrip transmission lines 17, comprising: substrate 16; interconnected electrical strip conductors 21, 21a disposed on an upper surface of the substrate 16; and an electrical conductor, here ground plane conductor 20, disposed on a bottom surface of the substrate 16. The microwave circuit 10 includes a resistor 14, here providing the power dissipating load 14, formed by hollow resistive material 34 passing vertically through the substrate 16; the resistor 14 being electrically connected between the one of the electrically interconnected electrical strip conductors 21 on the upper surface of the substrate 16, here electrical strip conductor 21a, and the second electrical conductor, here ground plane 20. As noted above, the microwave transmission lines 17, 17a have a predetermined impedance characteristic and the resistor 14 has a resistance matched to the predetermined impedance characteristic of the transmission lines 17, 17a.

The power limiter/load section 10 is formed as follows: Referring to FIG. 2C, the SiC substrate 16 is processed from the front or upper surface in any conventional manner to form the active devices FET 1 and FET 2 and strip conductors 21, 21a, here for example, gold, for the strip transmission lines 17, 17a (FIG. 2B), as shown, and the air bridges, as shown connecting the drain electrode (D) of PFET 2 to one of the trip conductors 21, as shown, and another connecting the source electrode (S) of FET 1 to the strip conductor 21a, as shown Next, the substrate 16 is thinned by grinding the bottom surface to desired thickness for formation of the microstrip transmission lines 17, 17a (FIG. 2B). Next, as shown in FIG. 2C, a mask 51 is formed over the bottom of the substrate 16 using common photolithography techniques leaving openings or windows in the photoresist to expose regions in the wafer where the desired vias 30, 32 (FIG. 2B) for both FET 2 source ground, on any other grounds, not shown, and resistive material of resistor 34 will be located, as shown in FIG. 2C. Next, the exposed portions of substrate 16 are removed either using a conventional chemical etch or reactive ion etching stopping on the back side of source contact S of FET FET 2 and back side of conductor 21a, to produce a tapered shaped vias, 30, 32 as shown. Next, the mask 51 is removed.

Next, the resistive material of resistor 34, here for example, tantalum nitride (TaN), is sputtered over the structure as shown in FIG. 2D including on the tapered sidewalls of the vias 30, 32 as shown in FIG. 2D and onto the bottom surface of strip conductor 21a, as shown, to desired thickness, T, to provide the desired resistance, R, here 50 ohms. Thus, the input impedance of the power dissipating load 14 is matched to the characteristic impedance, $Z_o$, of the microwave transmission lines 17. It is noted that resistive material, and hence the resistor 34 is hollow.

Next, referring to FIG. 2E, a mask 38 is formed photolithographically over the bottom surface of the substrate 16 to fill and thereby cover the hollow region of the resistive material to be used to form resistor 34; that is, the mask 38 is on the inner surface of the upper portion 34U of the resistive material 34' of resistor 34, the sidewalls portions 34S of the resistive material 34' of resistor 34, and the bottom portion 34B of the resistive material 34' of resistor 34, as shown but the remaining portions of the resistive material 34' to be used to form resistor 34 are exposed by the mask 38, as shown in FIG. 2E. More particularly, mask 38 will plug the via for the resistive material 34' to be used to form resistor 34 while the remaining area of the back-side of the wafer will be exposed or clear of mask 38. Thus, the sidewall portions 34S of the resistive material 34' to be used to form resistor 34, the top portion 34U of the resistive material 34' to be used to form resistor 34 and the bottom portions 34B of the resistive material 34' to be used to form resistor 34 under the sidewall portions 34S of the resistive material 34' to be used to form resistor 34 are masked while the remaining portions of the resistive material 34' to be used to form resistor 34 are unmasked.

Next, the exposed portion of the resistive material 34' to be used to form resistor 34 is removed here using a chemical etch. The mask 38 is then removed providing the structure shown in FIG. 2F; it being noted that the bottom portions 34B of the resistive material 34' to be used to form resistor 34 under the sidewall portions 34S of the resistive material 34' to be used to form resistor 34 extends beyond the bottom surface of the wafer 16, as shown in FIG. 3F.

Next, referring to FIG. 2G, a seed metal 19', such as, for example, TiW having a thickness of, for example, 500 Angstroms is formed, here by sputtering, over the bottom surface of the structure shown in FIG. 2F, to provide a portion of the seed layer 19 (FIG. 2B), in preparation for back-side plating to form the ground conductor 20 (FIG. 2B) over the bottom surface, as shown in FIG. 2G. It is noted that the seed metal 19' covers the entire back-side of the wafer 16 including the via 30 (FIG. 2F) for the FET 2 source (S) ground and the entire remaining resistive material 34' of resistor 34; the upper portion 34U, the sidewall portion 34S and the bottom portion 34B, as shown in FIG. 2G.

Next, a mask 37 is formed having a window 39 exposing only the portion of the seed metal 19' that is covering only the sidewalls portions 34S of the resistive material 34' and the upper portions 34U of the resistive material 34'; it being noted that the mask 37 covers the bottom portions 34B of the resistive material 34' under the sidewall portions 34S of the resistive material 34', to provide the structure shown in FIG. 20G.

Next, referring also to FIG. 2I, the portions of the seed metal 19' exposed by the window 39 are removed using any commercially available etchant, such as, for example, TiW-30 available from Transene Company Inc, Danvers Industrial Park, 10 Electronics 10o Avenue, Danvers, Mass. 01923, that is highly selective to the seed metal 19', TiW, as compared to the TaN resistive material 34'. The etchant will etch the seed metal 19' at a much faster rate than the TaN. Thus, while the etch will remove the seed metal 19' that is covering the sidewalls portions 34S of the resistive material 34' and the upper portions 34U of the resistive material 34'; the seed metal 19' will remain on the bottom portions 34b of the resistive material 34' under the sidewall portions 34S of the resistive material 34' as well as on the other portions on the bottom of the wafer 16 as well as on the sidewalls of the via 30 for the source contact S of FET 2, leaving the seed layer 19, as shown in FIG. 2I. Next, the mask 37 is removed leaving the structure shown in FIG. 2I.

Next, the remaining portions of the seed metal 19' now providing the seed layer 19 (FIG. 2B) is plated with a suitable conductive ground plane metal, here gold, to form the ground plane conductor 20 (FIG. 2B). It is noted that the gold will only plate where seed metal 19' is present leaving the upper portions 34U and sidewalls portion 34S of the resistive material 34' of resistor 34 un-plated and hence void of the gold or any other electrically conductive material; but with the gold will be plated on, and hence the ground plane conductor 20 will be formed on the portion 34B of the resistive material 34' of resistor 34, on the sidewalls of the FET 2 source contact via 30, and on the bottom portion substrate 16, as shown in FIG. 2B. Thus, the remaining portions of the resistive material 34' provide a hollow resistor 34 connected between the strip conductor 21a and the ground plane conductor 20, such resistor 34 having a length L and a thickness T. It is noted that the resistive material 34' and hence resistor 34, is hollow having a hole provided by via 32, as shown for example the tapered material in FIG. 2B'. To put it still another way, the hole provided by via 32 provides a predetermined gap, 40 um, relative to the 500 to 1000 Angstrom thick resistive material, to separate opposing outer, opposing sidewall portions 34S of the resistive material 34' of resistor 34. It should be understood the hole provided by via 32, need not have a circular cross section but rather the cross section can take other shapes such as, for example, oval, rectangular, square, or other regular or irregular closed loop shape. For example, referring to FIG. 3, an embodiment is shown where the vias 30' and 32' in FIG. 2B are formed using a laser to produce a cylindrical shaped vias. It is noted that the process steps described above in connection with FIGS. 2C through 2I would be used in processing the structure having cylindrical shaped vias to produce the structure shown in FIG. 3. It is also noted that the resistive material 34' and hence resistor 34 is hollow for both the structure shown in FIG. 2B and the structure shown in FIG. 3. Thus, here again a hollow resistor 34 is formed between the strip conductor 21a and the ground plane conductor 20, such resistor 34 having a length L and a thickness T.

Figure 3:
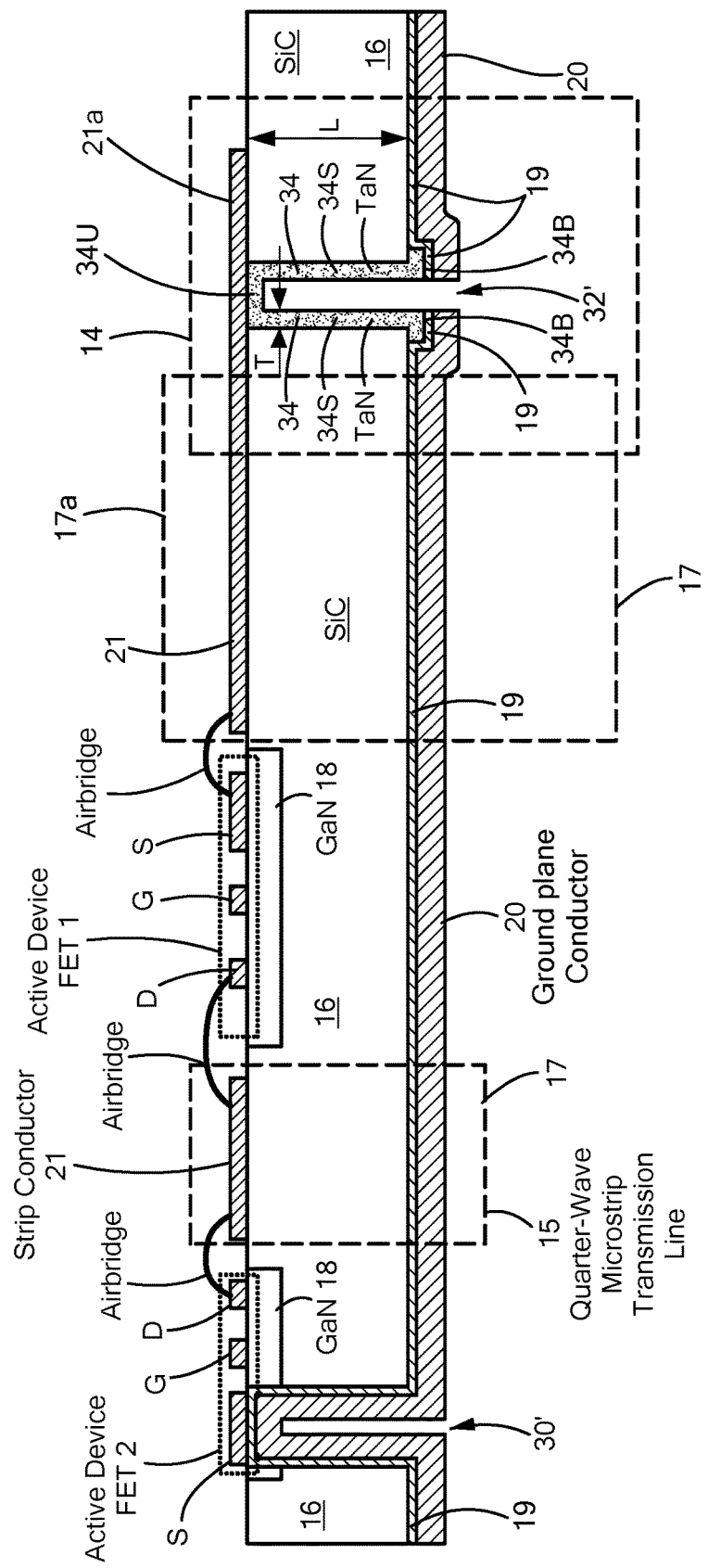
FIG. 3 is a cross sectional view of the load/limiter section of FIG. 2A according to the disclosure according to another embodiment of the disclosure.

Consider that the resistive material 34' in FIG. 2B or FIG. 3 has is a thickness T and extends a length L along the sidewalls of the via 32 and that the TaN has resistivity p; the resistance, R, of the TaN resistor 34 is:

$$R = \frac{\rho L}{2\pi(T^2)}$$

It is noted that the hole provided by via 32 passing vertically through the resistive material 34', shown for example in FIG. 2B' for the via with the annular-shaped cross section, allows for expansion of the resistive material 34' as such material 34' absorbs microwave power and as the absorbed power is conducted away to the SiC substrate 16.

A number of embodiments of the disclosure have been described. Nevertheless, it will be understood that various modifications may be made without departing from the spirit and scope of the disclosure. For example, several resistances can be formed and connected in parallel to increase power handling and requiring thinner TaN coatings. For example, by connecting, for example, four hollow resistors in parallel, each having a resistance of 200 ohms and each having a resistive material thickness of T/4, the power handing capacity of the resistive power dissipating load 14 is increased by a factor of four while the input impedance of the load 14 remains at 50 ohms. Also, other substrates made be used, such as for example, diamond wafer substrates. Also other resistive materials may be used such as for example tungsten or nichrome. Further, other types of microwave transmission lines may be used such as, for example, coplanar waveguide (CPW) transmission lines or stripline transmission lines. Still further, while here the hole provided by via 32 in the resistive material 34' is air, other dielectrics may be used including other fluid dielectrics both gaseous or liquid as for example as may be used for cooling Accordingly, other embodiments are within the scope of the following claims.

What is claimed is:

1. A microwave circuit, comprising:
   a microwave transmission line, comprising:
   a substrate;
   a first electrical conductor disposed on an upper surface of the substrate;
   a second electrical conductor disposed on a bottom surface of the substrate; and
   a resistor comprising a hollow resistor comprising a resistive material passing through the substrate, the hollow resistor being electrically connected between the first electrical conductor and the second electrical conductor.

2. The structure recited in claim 1 wherein the microwave transmission line has a predetermined impedance characteristic and wherein the resistor has a resistance matched to the predetermined impedance characteristic of the transmission line.

3. A Microwave Monolithic Integrated Circuit (MMIC) having an integrated, power dissipating load, comprising:
   a substrate;
   a microwave transmission line having a strip conductor disposed on an upper surface of the substrate and a ground plane conductor disposed on a bottom surface of the substrate; and
   wherein the load comprises a resistive load coupled to a terminating end of the microwave transmission line, the resistive load comprises a resistive material having a vertically extending hole therein, the resistive material being disposed on sidewalls of a via passing through the substrate, the resistive material having an upper portion electrically connected to a terminating end of the strip conductor and a lower portion electrically connected to the ground plane conductor.

4. A structure, comprising:
   a substrate;
   a microwave transmission line comprising: a strip conductor disposed on the upper surface of the substrate; and a ground plane conductor disposed on a bottom surface of the substrate, the microwave transmission line having an input end fed by a microwave signal;
   a resistive load coupled to a terminating end of the microwave transmission line;
   wherein the substrate has a via passing vertically there through between the terminating end of the microwave transmission line; and
   wherein the resistive load comprises a resistive material having a vertically extending hole therein, the resistive material being disposed on sidewalls of a via, the resistive material having an upper portion electrically connected to a terminating end of the strip conductor and a lower portion electrically connected to the ground plane conductor.

5. The structure recited in claim 4 wherein the microwave transmission line has a predetermined impedance characteristic and wherein the resistive of the load is matched to the predetermined impedance characteristic of the transmission line.

6. A monolithic integrated circuit, comprising:
   a substrate;
   a semiconductor layer disposed in an upper surface of the substrate;
   a ground plane conductor disposed on a bottom surface of the substrate a microwave circuit fed by a microwave signal, comprising:
      an active device formed with the semiconductor layer, the active device having: an input electrode fed by the microwave signal; a control electrode fed by a control signal; and an output electrode, the microwave signal fed to the input electrode being: coupled to the output electrode; or being electrically decoupled from the output electrode, selectively in accordance with the control signal;
      a microwave transmission line comprising: a strip conductor disposed on the upper surface of the substrate electrically connected to the output electrode of the active device; and
      a resistive load coupled to the output electrode, the resistive load comprising resistive material disposed on sidewalls of via, the via passing vertically through the substrate, the resistive material having an upper portion electrically connected to the strip conductor and a lower portion electrically connected to the ground plane conductor, the resistive material having a vertically extending hole therein.

7. The monolithic integrated circuit recited in claim 6 wherein the microwave transmission line has a predetermined impedance characteristic and wherein the resistive of the load is matched to the predetermined impedance characteristic of the transmission line.

8. A Microwave Monolithic Integrated Circuit (MMIC) having an integrated, power dissipating load, comprising:
a substrate;
a microwave transmission line having a strip disposed on an upper surface of the substrate and a ground plane conductor disposed on a bottom surface of the substrate; and
wherein the load comprises a resistive load coupled to a terminating end of the microwave transmission line, the resistive load comprises a resistive material disposed on sidewalls of a via passing through the substrate, the resistive material having an upper portion electrically connected to a terminating end of the strip conductor and a lower portion electrically connected to the ground plane conductor, the lower portion having a vertically extending hole therein.

9. The Microwave Monolithic Integrated Circuit (MMIC) recited in claim 8 wherein the microwave transmission line has a predetermined impedance characteristic and wherein the resistive of the load is matched to the predetermined impedance characteristic of the transmission line.

10. A monolithic integrated circuit, comprising:
a substrate;
a semiconductor layer disposed in an upper surface of the substrate;
a ground plane conductor disposed on a bottom surface of the substrate;
a microwave circuit fed by a microwave signal, comprising:
an active device formed with the semiconductor layer, the active device having: an input electrode fed by the microwave signal; a control electrode fed by a control signal; and an output electrode, the microwave signal fed to the input electrode being-coupled to the output electrode; or being electrically decoupled from the output electrode, selectively in accordance with the control signal;
a microwave transmission line comprising: a strip conductor disposed on the upper surface of the substrate electrically connected to the output electrode of the active device; and
a resistive load coupled to the output electrode, the resistive load disposed on sidewalls of via, the via passing vertically through the substrate, the resistive material having an upper portion electrically connected to the strip conductor and a lower portion electrically connected to the ground plane conductor, the resistive material having a vertically extending hole therein.

11. The monolithic integrated circuit recited in claim 10 wherein the microwave transmission line has a predetermined impedance characteristic and wherein the resistive of the load is matched to the predetermined impedance characteristic of the transmission line.

12. A Microwave Monolithic Integrated Circuit (MMIC) having an integrated, power dissipating load, comprising:
a substrate;
a microwave transmission line having a strip disposed on an upper surface of the substrate and a ground plane conductor disposed on a bottom surface of the substrate; and
wherein the load comprises a resistive load coupled to a terminating end of the microwave transmission line, the resistive load comprises a hollow resistive material, the resistor comprising resistive material being disposed on sidewalls of a via passing through the substrate, the resistive material having an upper portion electrically connected to a terminating end of the strip conductor and a lower portion electrically connected to the ground plane conductor.

13. The Microwave Monolithic Integrated Circuit (MMIC) recited in claim 12 wherein the resistive material has an annular shaped cross section.

14. The Microwave Monolithic Integrated Circuit (MMIC) recited in claim 12 wherein the resistive material is tapered outwardly from the upper portion to the lower portion.

15. The Microwave Monolithic Integrated Circuit (MMIC) recited in claim 12 wherein the resistive material is a hollow cylindrical shape.

16. A microwave monolithic integrated circuit, comprising:
a substrate;
a microwave transmission line having a strip disposed on an upper surface of the substrate and a ground plane conductor disposed on a bottom surface of the substrate; and
a resistive load coupled to a terminating end of the microwave transmission line, the resistive load comprises a resistive material, the resistive material inner sidewalls disposed on sidewalls of a via passing through the substrate, the resistive material having an upper portion electrically connected to a terminating end of the strip conductor and a lower portion electrically connected to the ground plane conductor, the resistive material having separated opposing outer sidewall portions.

17. The Microwave Monolithic Integrated Circuit (MMIC) recited in claim 3 wherein the opposing outer sidewall portions are separated by a gap.

\* \* \* \* \*